(12) United States Patent
Hung

(10) Patent No.: US 8,190,644 B2
(45) Date of Patent: May 29, 2012

(54) STORAGE DEVICE AND DATA STORAGE METHOD

(75) Inventor: Shih-Fang Hung, Chung Ho (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 162 days.

(21) Appl. No.: 12/784,372

(22) Filed: May 20, 2010

(65) Prior Publication Data

US 2010/0332486 A1    Dec. 30, 2010

(30) Foreign Application Priority Data

Jun. 29, 2009  (TW) ................................ 98121749 A

(51) Int. Cl.
*G06F 17/00* (2006.01)

(52) U.S. Cl. ......... 707/791; 707/802; 707/822; 707/828

(58) Field of Classification Search ........... 707/600–831
See application file for complete search history.

(56) References Cited

U.S. PATENT DOCUMENTS

2002/0169925 A1* 11/2002 Achiwa et al. ................ 711/112

* cited by examiner

*Primary Examiner* — Isaac M Woo
(74) *Attorney, Agent, or Firm* — Cheng-Ju Chiang

(57) ABSTRACT

A storage device adapted for receiving input data which includes a plurality of data units and each data unit includes a plurality of bits, includes a statistics unit computing a difference between "0" and "1" in each bit of the data units of the input data and providing a statistic result, a calculation unit producing transferable data according to the statistic result, and a transferring unit transferring the input data into programming data according to the transferrable data and storing the programming data and the transferrable data in the storage device.

10 Claims, 3 Drawing Sheets

512 bytes

| 1 0 1 0 0 1 0 1 | 1 0 1 0 1 1 0 0 | 0 0 1 1 1 1 0 0 | bit  7 6 5 4 3 2 1 0    7 6 5 4 3 2 1 0    7 6 5 4 3 2 1 0  ..........

One byte    One byte    One byte

FIG. 2

STORAGE DEVICE AND DATA STORAGE METHOD

BACKGROUND OF THE INVENTION

1. Field of the Invention

The present invention is related to a storage device and a data storage method, and more particularly to a non-volatile storage device and corresponding data storage method.

2. Description of the Related Art

With the increasing of the capacity of the flash memory and the decreasing of the price thereof, the Flash Memory device as of storage media is applicable in more environments. However, the reliability of the Flash Memory is lowered with the increased capacity of the Flash Memory. Accordingly, the research on the reliability of data storage via Flash Memory is more important to the research and development engineers.

A power supply unit of the Flash Memory will provide suitable voltage to the bit line and corresponding word line on the Flash Memory array when read/write Flash Memory. Due to the relationship between the structure of the memory cells array of the Flash Memory and the structure of the memory cell itself, memory cells are possibly affected by neighbored, charging/discharging memory cells which result in the quantity of electric charges stored in some memory cells is incorrect. Especially, when read/write some special data pattern (such as the data pattern with more "0" or the data pattern with more "1"), those neighbored memory cells are subject to disturbance which in turn affects correctness of storing the data in the Flash Memory.

Detailed structure and disturbs theory can be found in US Publication Nos. 20080065813, 20080205145 and 20080215798, all of which disclose programming methods for solving the reliability of storing data in Flash Memory. The main operating principle of these programming methods is to change the source into the random data pattern or avoids writing the data pattern with more "0". However, these operating methods require complex managing methods for changing the source data to the random data pattern. Obviously, it is not efficient.

Hence, it is desired to provide a storage device with improved data storage reliability and corresponding data storage method to solve the above-described problems.

SUMMARY OF THE INVENTION

Accordingly, an objective of the present invention is to provide a storage device and a storage method which have reliable data storage.

A storage device in accordance with the present invention is adapted for receiving input data which includes a plurality of data units and each data unit includes a plurality of bits. The storage includes a statistics unit computing a difference between "0" and "1" in each bit of the data units of the input data and providing a statistic result, a calculation unit producing transferable data according to the statistic result, and a transferring unit transferring the input data into programming data according to the transferrable data and storing the programming data and the transferrable data in the storage device.

Other objects, advantages and novel features of the invention will become more apparent from the following detailed description when taken in conjunction with the accompanying drawings.

BRIEF DESCRIPTION OF THE DRAWINGS

FIG. 2 is a schematic view showing cumulating differences between "0" and "1" in each bit of every byte in the embodiment.

DETAILED DESCRIPTION OF THE PREFERRED EMBODIMENTS

Reference will now be made in the detail to the preferred embodiments of the invention. While the present invention has been described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Figure 1:
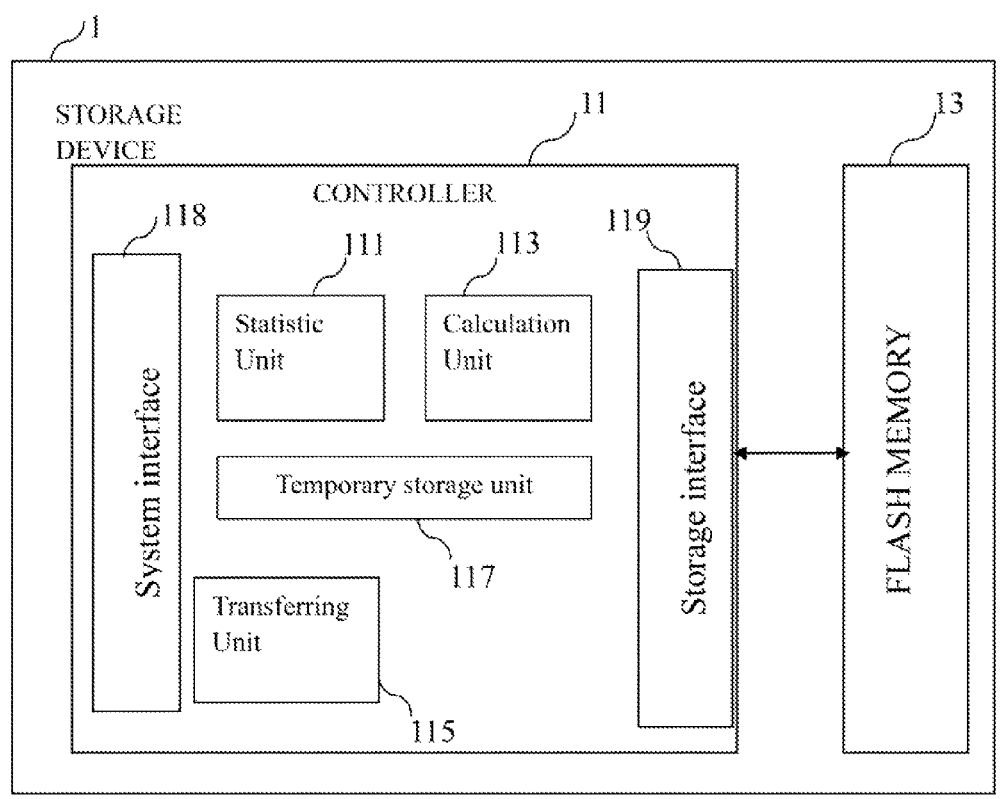
FIG. 1 is a schematic block diagram of a storage device in accordance with the present invention.

Referring to FIG. 1, a storage device in accordance with the present invention comprise a controller 11 and a flash memory 13. The controller 11 comprises a statistics unit 111, calculation unit 113, transferring unit 115, a temporary storage unit 117, system interface 118 and memory interface 119. The system interface 118 is used to transfer orders or data between the storage device 1 and a host computer. The memory interface 119 is used to transfer orders or data between the controller 11 and the flash memory 13.

Input data received by the storage device 1 includes one or more data units, each unit having a plurality of bits. For example, the data unit can be one byte and each byte has eight bits. Transferrable data is generated by compiling and calculating the input data. After the statistics, the input data is transferred to the programming data, in which the numeral difference between "0" and "1" is minimum. The transferrable data can be N bits data and N can be 4, 8, 16 or more, which depends on the requirement of precision or limitation to calculating capacity and the hardware. Every N bits from M bytes input data can be calculated with the transferrable data. After M/N times calculation, the M bytes input data is transferred to the programming data, in which the numeral difference between "0" and "1" is minimum. Understandably, M could be 512 or more.

In order to clearly illustrate the transferring method of the input data, an input data with 512 bytes is used as an example. The controller 11 of the storage device 1 stores the input data in the temporary storage unit 117 after receiving the input data. The statistics unit 111 cumulates the difference between "0" and "1" in each corresponding bit of every byte (bit0, bit1, bit2, bit3, bit4, bit5, bit6, bit7). As shown FIG. 2, every byte with 8 bits is regarded as a unit to cumulate the numeral differences of "0" and "1" on each bit (bit0, bit1 . . . ) In FIG. 2, 24 bits are shown. The number of "0" of bit0 is more than "1" by one. The number of "0" of bit1 is more than "1" by three. The rest can be done in the same manner. Finally, the statistical result is generated.

If the input data with 512 bytes has been all stored in the temporary storage unit 117, the statistics unit 111 can cumulate the numeral differences of "0" and "1" in each bit of all of the bytes. Then, the calculation unit 113 of the controller 11 performs a mathematics operation according to the statistic result and generates a transferable data with 1 byte. Consequently, the transferring unit 115 of the controller 11 calculates the transferrable data and the input data with one byte to generate programming data having minimum difference between "0" and "1" in the one byte.

It is assumed that final result is as follows: bit0: the number of "0" is more than the number of "1" by 48; bit1: the number of "0" is more than the number of "1" by 26; bit2: the number of "0" is less than the number of "1" by 33; bit3: the number of "0" is more than the number of "1" by 12; bit4: the number of "0" is less than the number of "1" by 50; bit5: the number of "0" is less than the number of "1" by 5; bit6: the number of "0" is more than the number of "1" by 27; bit7: the number of "0" is more than the number of "1" by 55. Details can be found in the following table:

| Bit0 | Bit1 | Bit2 | Bit3 | Bit4 | Bit5 | Bit6 | Bit7 |
|------|------|------|------|------|------|------|------|
| 0 > 1 | 0 > 1 | 0 < 1 | 0 > 1 | 0 < 1 | 0 < 1 | 0 > 1 | 0 > 1 |
| 48 | 26 | 33 | 12 | 50 | 5 | 27 | 55 |

The calculation unit 113 of the controller 11 calculates 48, 26, −33, 12, −50, −5, 27, 55 in order to get the transferrable data in which the summation of the eight differences is minimum (here, it is assumed that it is positive when "0>1"; however, it can be also assumed that it is positive when "0<1", which is −48, −26, 33, −12, 50, 5, −27, −55). The controller 11 can use either mathematics operation or permutation and combination.

Now, a calculating operation is shown as an example in order to more clearly illustrate the data transferring principle. Understandably, the claimed scope of the present invention is not limited to this exemplary embodiment. It will get absolute values of the above-mentioned numbers which are 48, 26, 33, 12, 50, 5, 27, 55 and get corresponding symbol data 00101100. By a mathematics operation, it is minimum when +48+26−33−12−50−5−27+55=2. Therefore, according to that $(48*(+1)+26*(+1)+33*(-1)+12*(-1)+50*(-1)+5*(-1)+27*(-1)+55*(+1))$ the positive is equal to 0 and the negative is equal to 1, the calculation data is 00111110. Since the sequence of number has been output the absolute value, it is needed to XOR the calculation data with the symbol data. Finally, the result is 00010010 after 00101100 XOR 00111110, which is also the transferable data of this 512 bytes input data.

The transferrable data can be deemed as a mask of performing an inverting operation or not. It is selective to invert the special bit in the input data by XOR every byte input data and the transferable data. By such a manner, the programming data is generated in which the difference between "0" and "1" is the least. That is, each bit of the input data is calculated with the transferrable data. The transferred programming data realized the result of $(48*(+1)+26*(+1)+33*(-1)+12*(-1)+50*(-1)+5*(-1)+27*(-1)+55*(+1))$.

Therefore, the input data can be calculated with the transferrable data and then the programming data together with the transferrable data are transmitted to the flash memory. As for the present embodiment, the input data with 512 bytes and corresponding transferrable with one byte are transmitted to the flash memory. After reading the data and corresponding transferrable data, they will be subject to another reverting calculation. Consequently, the original input data is output.

Figure 3:
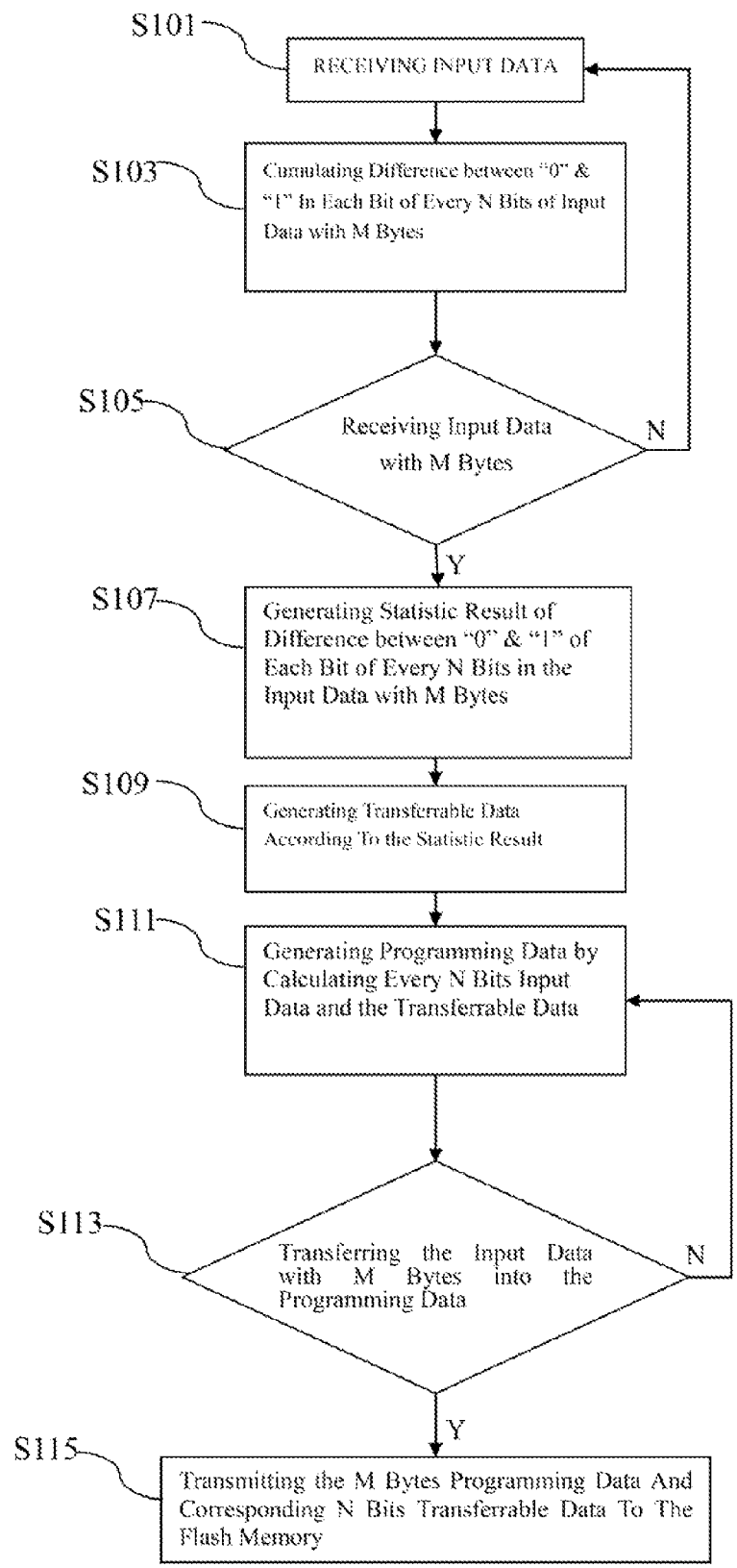
FIG. 3 is a flowchart showing the process of storing data in the Flash Memory.

A detailed introduction on the flow chart of storing the data in the flash memory will be given below. As shown in FIG. 3, the controller 11 receives the input data S101 from the host computer system through the system interface 118 and stores the input data in the temporary storage unit 117. Then, in the step of S103, the statistics unit 111 cumulates the differences between "0" and "1" in each bit of every N bits of M bytes input data. In the step of S105, the controller judges whether the M bytes input data has been received. If all of the M bytes input data are received, in the step of S107, the statistic unit 111 generates the statistic result of the differences between "0" and "1" in each bit of every N bits of the M bytes input data. In the step of S109, the calculation unit 113 generates the transferrable data with N bits according to the statistic result. It should be noted that the transferrable data, in which the summation of these differences is minimum, can be achieved by the calculation unit 113 either via performing a mathematics operation or via performing permutation and combination. The programming data is generated through the transferring unit 115 by calculating the input data and the transferrable data. In the step of S111, the programming data with N bits is generated by the above-described method. After that, the controller 11 will judge whether the input data with M bytes has been transferred to be the programming data in the step of S113. Then, in the step of S115, the controller 11 transmits the programming data and corresponding transferrable data to the flash memory 13 through the storage interface 119. The data can also be transmitted after several programming data are generated.

The amounts of "0" and "1" of the data written in the flash memory 13 are average, which reduce the disturbances between the neighbored memory cells in the storage array that affected by the working voltages thereof.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed. For example, the Flash Memory is an exemplary embodiment in the description. As known to those having ordinary skills in the art, it is obvious that the Flash Memory is only one of the types of non-volatile storage device. In fact, the present invention can also be applied to other types of non-volatile storage device, such as EPROM (Erasable Programmable Read Only Memory), EEPROM (Electrically Erasable Programmable Read Only Memory), PRAM (Phase-change Random Access Memory), MRAM (Magnetic Random Access Memory), FRAM (Ferroelectric Random Access Memory), etc.

What is claimed is:
1. A storage method for using in a storage device, comprising the following steps:
   receiving an input data, said input data including a plurality of data units, each data unit including a plurality of bits;
   computing differences between "0" and "1" in each bit of said plurality of data units and getting a statistical result;
   generating transferable data according to said statistical result;
   transferring said input data to programming data according to said transferable data; and
   storing said programming data and said transferable data in said storage device;
   wherein the step of generating transferable data further comprises following steps:
   generating symbol data according to respective positive sign and negative sign of said differences;
   outputting absolute value of corresponding difference of each bit;
   generating calculation data by performing a mathematical operation in which the summation of said differences is minimum; and
   generating said transferable data by calculating said calculation data and said symbol data.

2. The storage method as claimed in claim 1, wherein the step of generating transferable data further comprises a step of performing a mathematical operation in which the summation of said differences is minimum.

3. The storage method as claimed in claim 2, wherein said mathematical operation is to multiply each difference by a positive sign or a negative sign.

4. The storage method as claimed in claim 1, wherein said mathematical operation is to multiply each difference by a positive sign or a negative sign.

5. The storage method as claimed in claim 1, wherein said step of transferring said input data to programming data comprises a step of inverting said input data according to said transferable data to get said programming data.

6. A storage device, adapted for receiving input data which includes a plurality of data units and each data unit includes a plurality of bits, comprising:
   a statistics unit computing a difference between "0" and "1" in each bit of said data units of said input data and providing a statistic result;
   a calculation unit producing transferable data according to said statistic result; and
   a transferring unit transferring said input data into programming data according to said transferable data and storing said programming data and said transferrable data in said storage device;
   wherein said calculation unit generates symbol data according to respective positive sign and negative sign of said differences, outputs absolute value of corresponding difference of each bit, generates calculation data by performing a mathematical operation in which a summation of said differences is minimum, and generates said transferable data by XOR said calculation data and said symbol data.

7. The storage device as claimed in claim 6, wherein said calculating unit performs a mathematical operation in which a summation of said differences is minimum and then provides said transferable data.

8. The storage device as claimed in claim 7, wherein said mathematical operation is to multiply each difference by a positive sign or a negative sign.

9. The storage device as claimed in claim 6, wherein said mathematical operation is to multiply each difference by a positive sign or a negative sign.

10. The storage device as claimed in claim 6, wherein said programming data is generated by said transferring unit via inverting said input data according to said transferable data.

* * * * *